(12) United States Patent
Lee et al.

(10) Patent No.: US 11,165,286 B1
(45) Date of Patent: Nov. 2, 2021

(54) ADAPTIVE BASELINE CORRECTION FOR DELTA AMPLIFICATION

(71) Applicant: STMicroelectronics Asia Pacific Pte Ltd, Singapore (SG)

(72) Inventors: Teerasak Lee, Singapore (SG); Chee Weng Cheong, Singapore (SG); Yannick Guedon, Singapore (SG); Eng Jye Ng, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 16/899,990

(22) Filed: Jun. 12, 2020

(51) Int. Cl.
| | | |
|---|---|---|
| H01F 27/42 | (2006.01) | |
| H01F 37/00 | (2006.01) | |
| H01F 38/00 | (2006.01) | |
| H02J 50/80 | (2016.01) | |
| H03F 1/02 | (2006.01) | |
| H02J 50/10 | (2016.01) | |
| H02J 50/00 | (2016.01) | |

(52) U.S. Cl.
CPC ............ *H02J 50/80* (2016.02); *H02J 50/005* (2020.01); *H02J 50/10* (2016.02); *H03F 1/0211* (2013.01); *H03F 2200/331* (2013.01)

(58) Field of Classification Search
CPC . H02J 5/005; H02J 7/025; H02J 17/00; H01F 38/14; B60L 11/182
USPC ........................................................ 307/104
See application file for complete search history.

(56) References Cited

U.S. PATENT DOCUMENTS

| | | | | |
|---|---|---|---|---|
| 5,376,891 | A  * | 12/1994 | Kirchlechner | ........... H03D 1/22 327/156 |
| 2004/0043744 | A1 | 3/2004 | Schlegel et al. | |
| 2007/0216562 | A1* | 9/2007 | Teo | ..................... H03M 1/1019 341/155 |
| 2008/0159414 | A1 | 7/2008 | Brecher et al. | |
| 2010/0073798 | A1 | 3/2010 | Cao | |
| 2012/0019946 | A1 | 1/2012 | Aravind | |
| 2013/0201729 | A1* | 8/2013 | Ahsanuzzaman | ........................... H02M 3/33507 363/21.12 |
| 2014/0085117 | A1* | 3/2014 | Hurrell | ............... H03M 1/1245 341/122 |
| 2017/0155399 | A1* | 6/2017 | Tsai | ..................... H03M 1/1245 |
| 2017/0162275 | A1* | 6/2017 | Gao | .................... G01R 19/2509 |

FOREIGN PATENT DOCUMENTS

JP  2008125046 A  *  5/2008  .......... H03M 1/1225

* cited by examiner

*Primary Examiner* — Quan Tra
(74) *Attorney, Agent, or Firm* — Crowe & Dunlevy

(57) ABSTRACT

A data demodulating circuit includes a sensing circuit sensing a power signal applied to a coil at first and second times, and outputting an analog value representing a difference in voltage of the power signal at the first and second times. An analog-to-digital converter digitizes the analog value output by the analog voltage differential sensing circuit to produce a digital code. A compensation circuit, over a period of time, compares a present value of the digital code to a first value of the digital code during the period, and subtracts a given value from the present value of the digital code if the present value is greater than the first value but add the given value to the present value of the digital code if the present value is less than the first value. An accumulator accumulates output of the compensation circuit, and a filter filters output of the accumulator.

18 Claims, 4 Drawing Sheets

ADAPTIVE BASELINE CORRECTION FOR DELTA AMPLIFICATION

TECHNICAL FIELD

This disclosure is directed to the field of wireless power transmission and, in particular, to hardware, operating techniques for the hardware, and methods for demodulating data modulated onto a wireless power transmission.

BACKGROUND

Portable electronic devices, such as smartphones, smartwatches, audio output devices (earbuds, headphones), and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. A typical wireless power transmission system utilizes a transmitter formed by a transmission coil driven by time varying electric power from a power source to form a time-varying electric field, and a receiver formed by a receiver coil in which the time-varying electric field induces an AC current that is in turn rectified and used to drive a load, such as a rechargeable battery.

It is desired for data communication between transmitter and receiver to be possible, for example to effectuate a desired or safe amount of power transfer. Typically, data is transmitted from transmitter to receiver by the transmitter modulating the frequency of the power signal flowing through the transmission coil, which is known as frequency shift keying (FSK). Conversely, data is transmitted from receiver to transmitter by the receiver modulating its impedance, inducing measurable electrical changes in the power signal at the transmitter coil, which is known as amplitude shift keying (ASK).

Typically, in wireless power transmission systems, the transmitter is a single purpose device (such as a charging pad) onto which the receiver (such as a smartphone) is placed. For such wireless power transmission together with the accompanying data transmission, common known arrangements are suitably effective.

However, in some instances, it is desired to incorporate a wireless power transceiver into a device, such as a smartphone, to allow the device to both receive and transmit power wirelessly. Here, additional challenges with incorporating data transmission arise, because typical hardware for demodulating data received via ASK consumes an undesirable amount of space, and such space is rather limited inside some devices, such as smartphones. In addition, typical hardware for demodulating data received via ASK utilizes digital memories and digital filters which are to handle data words containing a large number of bits, which increases cost.

As such, further development of ASK demodulating systems is required, particularly for use in devices containing a wireless power transceiver.

SUMMARY

Disclosed herein is a wireless power transceiver, including: a transceiver coil having first and second terminals; a controlled switching bridge circuit having first and second inputs coupled to the first and second terminals of the transceiver coil, the controlled switching bridge circuit also having first and second outputs, the second output being coupled to ground; a controller configured to generate control signals for the controlled switching bridge circuit to cause the controlled switching bridge circuit to generate a time varying signal in a transmitter mode across its first and second inputs; an analog voltage differential sensing circuit configured, when in the transmitter mode, to sense a power signal across the first and second inputs of the controlled switching bridge circuit at first and second times, and output an analog value representing a difference in voltage of the power signal at the first and second times; an analog to digital converter configured to digitize the analog value output by the analog voltage differential sensing circuit to produce a digital code; a compensation circuit configured to, over a period of time, compare a present value of the digital code to a first value of the digital code during the period of time, and subtract a given value from the present value of the digital code if the present value is greater than the first value but add the given value to the present value of the digital code if the present value is less than the first value; an accumulator configured to accumulate output of the compensation circuit; and a filter configured to filter output of the accumulator.

The given value may be a digital one.

The filter may be a bandpass filter.

The analog voltage differential sensing circuit may include: a first switch coupled between an input and a first node, wherein the first switch is closed when a first control signal is asserted but otherwise open; a sample/hold capacitor coupled between the first node and ground; a second switch coupled between the first node and a gain capacitor, wherein the second switch is closed when a second control signal is asserted but otherwise open; an amplifier having a non-inverting terminal coupled to ground, an inverting terminal coupled to the gain capacitor, and an output coupled to the analog to digital converter; a feedback capacitor coupled between the non-inverting terminal and output of the amplifier; and a reset switch coupled in series with the feedback capacitor, wherein the reset switch is closed when a third control signal is asserted but otherwise open.

Also disclosed herein is a data demodulating circuit, including: an analog voltage differential sensing circuit configured to sense a power signal applied to a coil at first and second times, and to output an analog value representing a difference in voltage of the power signal at the first and second times; an analog to digital converter configured to digitize the analog value output by the analog voltage differential sensing circuit to produce a digital code; a compensation circuit configured to, over a period of time, compare a present value of the digital code to a first value of the digital code during the period of time, and subtract a given value from the present value of the digital code if the present value is greater than the first value but add the given value to the present value of the digital code if the present value is less than the first value; an accumulator configured to accumulate output of the compensation circuit; and a filter configured to filter output of the accumulator.

The given value may be a digital one.

The filter may be a bandpass filter.

The analog voltage differential sensing circuit may include: a first switch coupled between an input and a first node, wherein the first switch is closed when a first control signal is asserted but otherwise open; a sample/hold capacitor coupled between the first node and ground; a second switch coupled between the first node and a gain capacitor, wherein the second switch is closed when a second control signal is asserted but otherwise open; an amplifier having a non-inverting terminal coupled to ground, an inverting terminal coupled to the gain capacitor, and an output coupled to the analog to digital converter; a feedback capacitor coupled between the non-inverting terminal and output of the amplifier; and a reset switch coupled in series with the feedback capacitor, wherein the reset switch is closed when a third control signal is asserted but otherwise open.

Also disclosed herein is a wireless power transceiver, including: a transceiver coil having first and second terminals; a controlled switching bridge circuit having first and second inputs coupled to the first and second terminals of the transceiver coil, the controlled switching bridge circuit also having first and second outputs, the second output being coupled to ground; a voltage regulator coupled between the first output of the controlled switching bridge circuit and an output node; a power source; a controller configured to: in a receiver mode, generate control signals for the controlled switching bridge circuit to cause the controlled switching bridge circuit to rectify a time-varying signal at its first and second inputs to produce a rectified output voltage across its first and second outputs; and in a transmitter mode, generate the control signals for the controlled switching bridge circuit to cause the controlled switching bridge circuit to generate a time varying signal across its first and second inputs from the power source; switch circuitry configured to couple the power source between the output node and ground when the controller is in the receiver mode, but to couple the power source between the first output of the controlled switching bridge circuit and ground when the controller is in the transmitter mode; an analog voltage differential sensing circuit configured to, when the controller is in the transmitter mode, sense a power signal across the first and second inputs of the controlled switching bridge circuit at first and second times, and output an analog value representing a difference in voltage of the power signal at the first and second times; an analog to digital converter configured to digitize the analog value output by the analog voltage differential sensing circuit to produce a digital code; a compensation circuit configured to, over a period of time, compare a present value of the digital code to a first value of the digital code during the period of time, and subtract a given value from the present value of the digital code if the present value is greater than the first value but add the given value to the present value of the digital code if the present value is less than the first value; an accumulator configured to accumulate output of the compensation circuit; and a filter configured to filter output of the accumulator.

The given value may be a digital one.

The filter may be a bandpass filter.

The analog voltage differential sensing circuit may include: a first switch coupled between an input and a first node, wherein the first switch is closed when a first control signal is asserted but otherwise open; a sample/hold capacitor coupled between the first node and ground; a second switch coupled between the first node and a gain capacitor, wherein the second switch is closed when a second control signal is asserted but otherwise open; an amplifier having a non-inverting terminal coupled to ground, an inverting terminal coupled to the gain capacitor, and an output coupled to the analog to digital converter; a feedback capacitor coupled between the non-inverting terminal and output of the amplifier; and a reset switch coupled in series with the feedback capacitor, wherein the reset switch is closed when a third control signal is asserted but otherwise open.

Also disclosed herein is a wireless power transceiver, including: a transceiver coil having first and second terminals; a controlled switching bridge circuit having first and second inputs coupled to the first and second terminals of the transceiver coil, the controlled switching bridge circuit also having first and second outputs, the second output being coupled to ground; a controller configured to generate control signals for the controlled switching bridge circuit to cause the controlled switching bridge circuit to generate a time varying signal in a transmitter mode across its first and second inputs; an analog voltage differential sensing circuit configured, when in the transmitter mode, to sense a power signal across the first and second inputs of the controlled switching bridge circuit at first and second times, and output an analog value representing a difference in voltage of the power signal at the first and second times; an analog to digital converter configured to digitize the analog value output by the analog voltage differential sensing circuit to produce a digital code, the digital code having a baseline value; and a compensation circuit configured to compensate the baseline value for drift.

The compensation circuit may compensate for the drift by, over a period of time, determining presence of the drift by comparing a present value of the digital code to a first value of the digital code during the period of time, and modifying the digital code based upon the comparison.

The analog voltage differential sensing circuit may include: a first switch coupled between an input and a first node, wherein the first switch is closed when a first control signal is asserted but otherwise open; a sample/hold capacitor coupled between the first node and ground; a second switch coupled between the first node and a gain capacitor, wherein the second switch is closed when a second control signal is asserted but otherwise open; an amplifier having a non-inverting terminal coupled to ground, an inverting terminal coupled to the gain capacitor, and an output coupled to the analog to digital converter; a feedback capacitor coupled between the non-inverting terminal and output of the amplifier; and a reset switch coupled in series with the feedback capacitor, wherein the reset switch is closed when a third control signal is asserted but otherwise open.

An accumulator may be configured to accumulate output of the compensation circuit.

A filter may be configured to filter output of the accumulator.

Also disclosed herein is a method of operating a wireless power transceiver, including: operating a controlled switching bridge to generate a time varying signal across its first and second inputs that are coupled to first and second terminals of a transceiver coil; sensing a power signal across the first and second inputs of the controlled switching bridge at first and second times, and outputting an analog value representing a difference in voltage of the power signal at the first and second times; digitizing the analog value to produce a digital code, the digital code having a baseline value; and compensating the baseline value for drift.

The baseline value may be compensated for drift by, over a period of time, determining presence of the drift by comparing a present value of the digital code to a first value of the digital code during the period of time, and modifying the digital code based upon the comparison.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
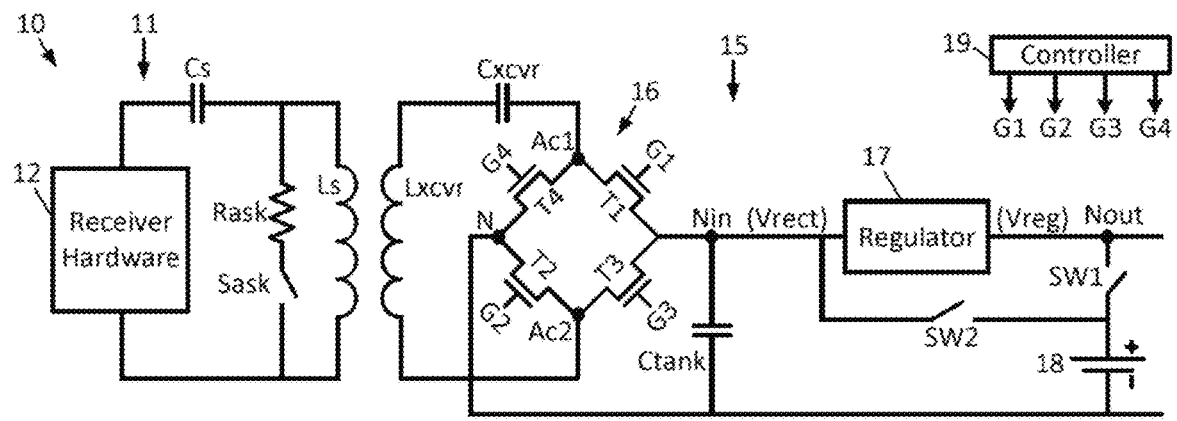
FIG. 1 is a schematic block diagram of a wireless power transmission system disclosed herein.

Shown in FIG. 1 is a wireless power transmission system 10. The wireless power transmission system 10 is comprised of a first device 11 and a second device 15. The first device 11 may be a device to be wirelessly charged, such as a charging case for a pair of wireless earbuds, and the second device 15 may be a device capable of both wireless power transmission and wireless power reception, such as a smartphone.

The first device 11 includes a receiver coil Ls (a secondary; the capacitance Cs represents the capacitance of the receiver coil) in which a time-varying current is induced by a time-varying electric field, and receiver hardware 12 that rectifies, regulates, and makes use of the time-varying current induced in the receiver coil Ls to provide power to the device 11, for example to charge its battery.

The second device 15 includes a controlled switching bridge circuit (operable as either a bridge rectifier or a DC-AC inverter) 16 coupled to a transceiver coil Lxcvr at nodes Ac1 and Ac2, with the capacitor Cxcvr representing the capacitance of the transceiver coil Lxcvr. The controlled switching bridge circuit 16 is comprised of: an n-channel transistor T1 having its source coupled to node Ac1, its drain coupled to node Nin, and its gate coupled to the gate voltage G1; an n-channel transistor T2 having its source coupled to node N, its drain coupled to node Ac2, and its gate coupled to the gate voltage G2; an n-channel transistor T3 having its source coupled to node Ac2, its drain coupled to node Nin, and its gate coupled to the gate voltage G3; and an n-channel transistor T4 having its source coupled to node N, its drain coupled to node Ac1, and its gate coupled to the gate voltage G4. A tank capacitor Ctank is coupled between node Nin and node N. A voltage regulator 17 has an input coupled to node Nin and an output coupled to node Nout. A battery 18 is selectively coupled between node Nout and node N by a switch SW1, and is selectively coupled between the node N and node Nin by a switch SW2. The switches SW1 and SW2 operate out of phase with one another; switch SW1 is closed while switch SW2 is opened when the second device 15 operates as a receiver in a power reception mode with the circuit 16 functioning as an AC-DC rectifier and the regulator functioning to generate the regulated voltage Vreg for charging the battery, and switch SW1 is opened while switch SW2 is closed when the second device 15 operates as a transmitter in a power transmission mode with the circuit 16 functioning as a DC-AC inverter powered by the battery. A controller 19 generates the gate voltages G1-G4 for controlling the bridge 16 to operate in the desired rectifier/inverter mode.

When the second device 15 operates as a receiver, the controlled switching bridge circuit 16 rectifies the AC current to produce a DC current that charges the tank capacitor Ctank connected to the node Nin, and a rectified voltage Vrect is formed across the tank capacitor Ctank. The voltage regulator 17 produces a regulated output voltage Vreg at its output node Nout, which is provided to the battery 18 to thereby charge the battery 18.

When the second device 15 operates as a transmitter, the voltage of the battery 18 is applied to the node Nin by switch SW2 and becomes the voltage Vrect. Then, the gate voltages G1-G4 are driven by the controller 19 so as to generate a time-varying current flowing through the transceiver coil Lxcvr. Details of this control scheme may be found in U.S. patent application Ser. No. 16/669,068, filed Oct. 30, 2019, the contents of which are incorporated by reference in their entirety.

When the second device 15 operates in the power transmission mode, the first device 11 may transmit data to the second device 15 via amplitude shift keying (ASK) by modulating the impedance of the receiver coil Ls, which, through the inductive coupling between the receiver coil Ls and the transceiver coil Lxcvr, induces measurable electrical changes in the power signal at the transceiver coil Lxcvr. To enable this operation, the first device 11 includes series connected resistor Rask and switch Sask coupled in parallel with the receiver coil Ls. By switching the switch Sask between open and closed positions (by "keying" the switch Sask), the impedance of the receiver coil Ls changes, and in turn changes are induced in the current and/or voltage of the power signal at the transceiver coil Lxcvr. By demodulating the power signal, the data transmitted from the first device 11 to the second device 15 can be recovered.

Figure 2:
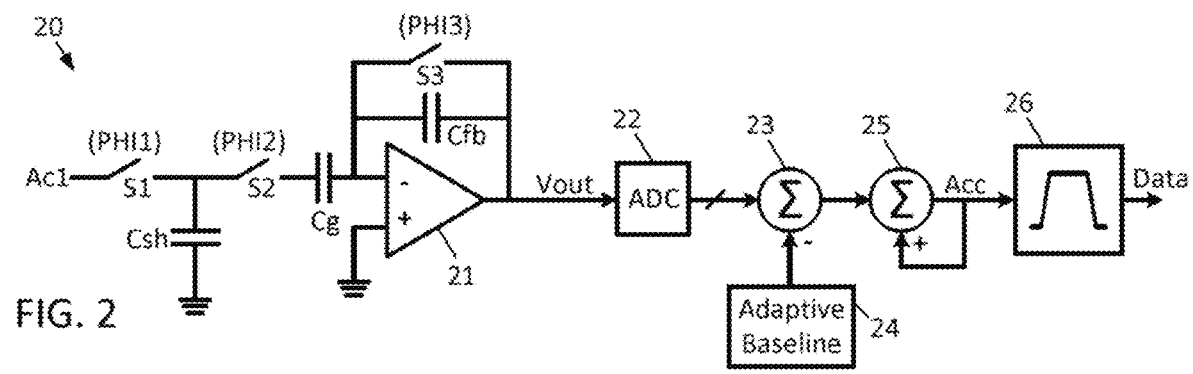
FIG. 2 is a schematic block diagram of a data demodulation circuit for use with the wireless power transmission system of FIG. 1.

With reference to FIG. 2, demodulation circuitry 20 within the second device 15 for demodulating and digitizing received data symbols is now described. The demodulation circuitry 20 includes an input IN receiving an input time varying signal carrying data symbols encoded using amplitude shift keying (ASK). Switches S1 and S2, and a capacitor Cg, are connected in series between the input node Ac1 and the inverting input of an amplifier 21, the amplifier 21 having its non-inverting input coupled to ground. Switch S1 is closed when the control signal PHI1 is at a logic high, and is otherwise open; switch S2 is closed when the control signal PHI2 is at a logic high, and is otherwise open. A sample/hold capacitor Csh is coupled between the switches S1 and S2 and ground. The amplifier 21 has a feedback capacitor Cfb coupled between its inverting input and its output, and has a reset switch S3 coupled in parallel with the feedback capacitor Cfb. The switch S3 is closed when the control signal PHI3 is at a logic high, and is otherwise open.

Figure 3:
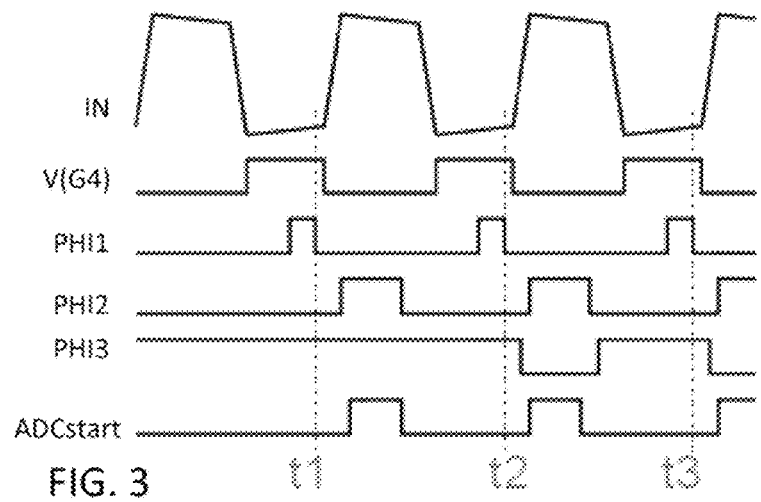
FIG. 3 is a graph showing operation of the analog voltage differential sensing circuit of FIG. 2.

Reference is now additionally made to FIG. 3. In operation, at time T1 when PHI1 is at a logic high (during which time PHI2 is at a logic low and PHI3 is at a logic high), the switch S1 closes, sampling the current voltage of the input signal Ac1 across the sample hold capacitor Csh. When PHI1 transitions back to a logic low to open switch S1, and then PHI2 rises to a logic high to close switch S2, the sampled voltage of the input signal Ac1 is stored in the capacitor Cg due to the capacitors Csh and Cg being in series. When PHI1 is again high at time T2 to close the switch S1 (at which time PHI2 is low so switch S2 is closed), the current voltage of the input signal Ac1 is then stored across the sample hold capacitor Csh. Thus, at this point, the current voltage of the input signal Act is stored across the capacitor Csh and the prior voltage of the input signal Ac1 is stored across the capacitor Cg.

Therefore, between times T2 and T3, when PHI1 transitions low and PHI2 transitions high such that switch S1 opens and switch S2 closes, charge is shared between capacitors Csh and Cg, meaning that the difference between the voltage of the input signal Ac1 at time T1 and the voltage of the input signal Ac1 at time T2 is stored across the capacitors Csh and Cg. Additionally, between times T2 and T3, PHI3 transitions low to open switch S3, so the difference between the voltage of the input signal Ac1 at time T1 and the voltage of the input signal Ac1 at time T2 is amplified by the amplifier 21 to produce the output voltage Vout.

An analog to digital converter 22 digitizes the output voltage Vout output by the amplifier 21, and the resulting digital value is summed by the digital summer 23 with a value from adaptive baseline generation circuitry 24. The output of the digital summer 23 is accumulated by an accumulator loop formed by digital summer 25 to produce an accumulated digital value Acc, which is then filtered by the bandpass filtered 26 to produce output data.

Ideally, the output Acc of the accumulator 25 changes solely by the value of the data (the difference between the voltage of the input signal Ac1 at time T1 and the voltage of the input signal Ac1 at time T2, for example). However, a problem could arise where the baseline output of the ADC 22 (what the output of the ADC 22 would be when there is no incoming signal at the input Ac1) drifts due to a variety of possible issues.

The baseline output of the ADC 22 can drift, for example, due to increased leakage across the switch S3 when operating temperature increases, in turn increasing the offset of the amplifier 21. The change in offset of the amplifier 21 can in turn vary quantization error of the ADC 22. In addition, when the load of the first device 11 changes, the power signal through the transceiver coil Lxcvr changes, and as a result, the input signal Ac1 sampled by the ADC 22 changes. In addition, changes in operating temperature can also vary the power signal through the transceiver coil Lxcvr, which can also change the input signal Ac1 sampled by the ADC 22.

Figure 4:
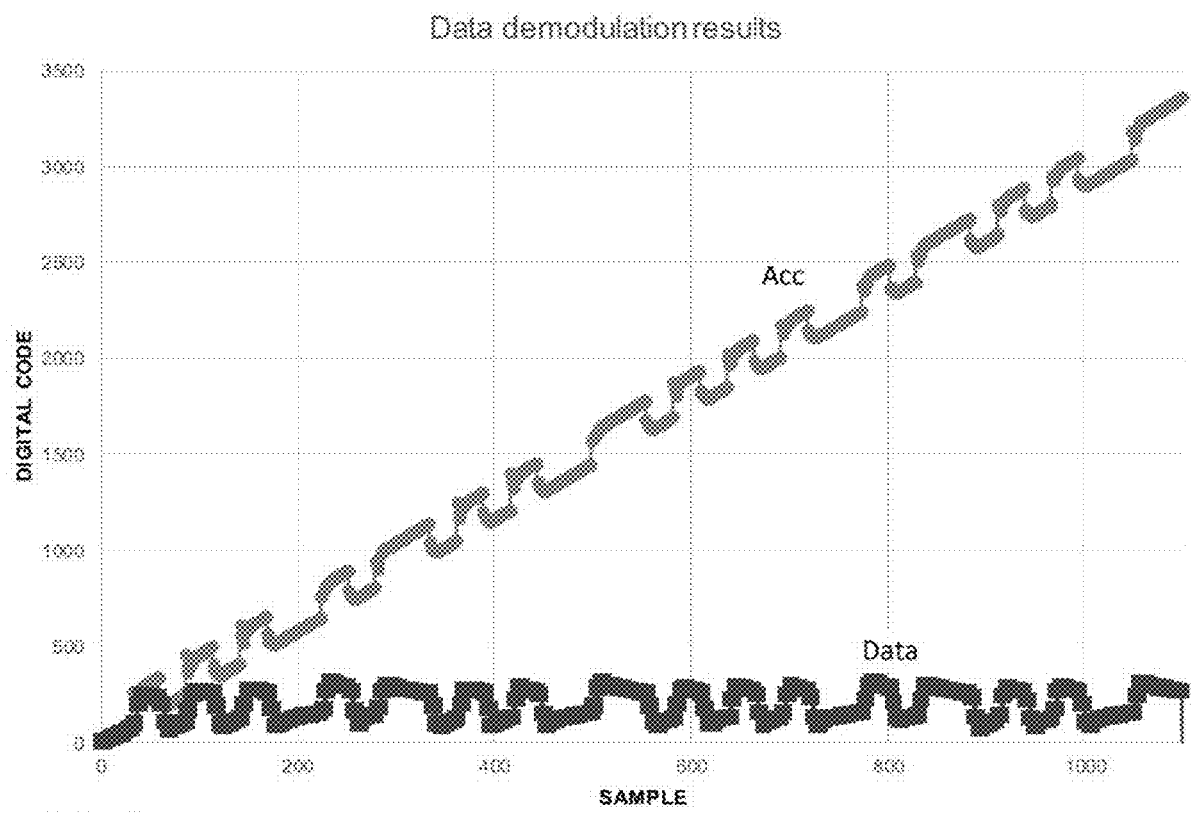
FIG. 4 is a graph showing accumulator output and data output of the data demodulation circuit of FIG. 2, when operating without adaptive baseline adjustment.

When the baseline drifts, the accumulated digital value Acc drifts accordingly, meaning that the slope of the accumulated digital value Acc increases excessively. This potential issue of a drifting accumulated digital value Acc can be observed in FIG. 4 (which specifically illustrates an instance with an upward drift in the baseline). While it is possible to remove the results of this drift from the output data as shown, if the drift results in the accumulator 25 and/or the digital filter 26 overflowing, data will be lost. While the memory size of the accumulator 25 could be increased to help prevent this, this increases cost and area consumption, and moreover, means that the size of the memory of the digital filter 26 would need to be increased accordingly.

Figure 5:
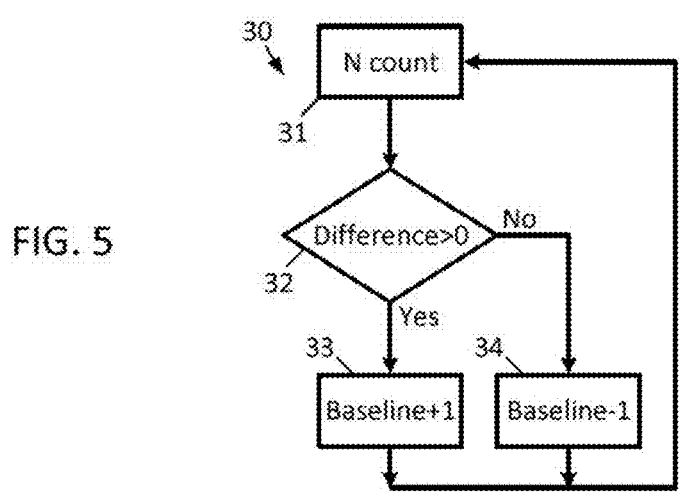
FIG. 5 is a flowchart explaining operation of the data demodulation circuit of FIG. 2 when performing adaptive baseline adjustment.

Therefore, the digital summer 23 and adaptive baseline generation circuitry 24 are used to adjust the baseline. As shown in the flowchart 30 of FIG. 5, over a period of N samples (Block 31), the current nth value of the accumulated digital value Acc is compared to the first accumulated digital value Acc of the period. If the difference is positive (Block 32), this indicates that the baseline has drifted upward and then the adaptive baseline generation circuitry 24 performs a correction by adding one to the baseline by subtracting one from the output of the ADC 22, therefore shifting the digital waveform represented by the output of the ADC 22 down (Block 33); conversely, if the difference is negative (Block 32), this indicates that the baseline has drifted downward and then the adaptive baseline generation circuitry 24 performs a correction by subtracting one from the baseline by adding one to the output of the ADC 22, therefore shifting the digital waveform represented by the output of the ADC 22 upward (Block 34).

Figure 6:
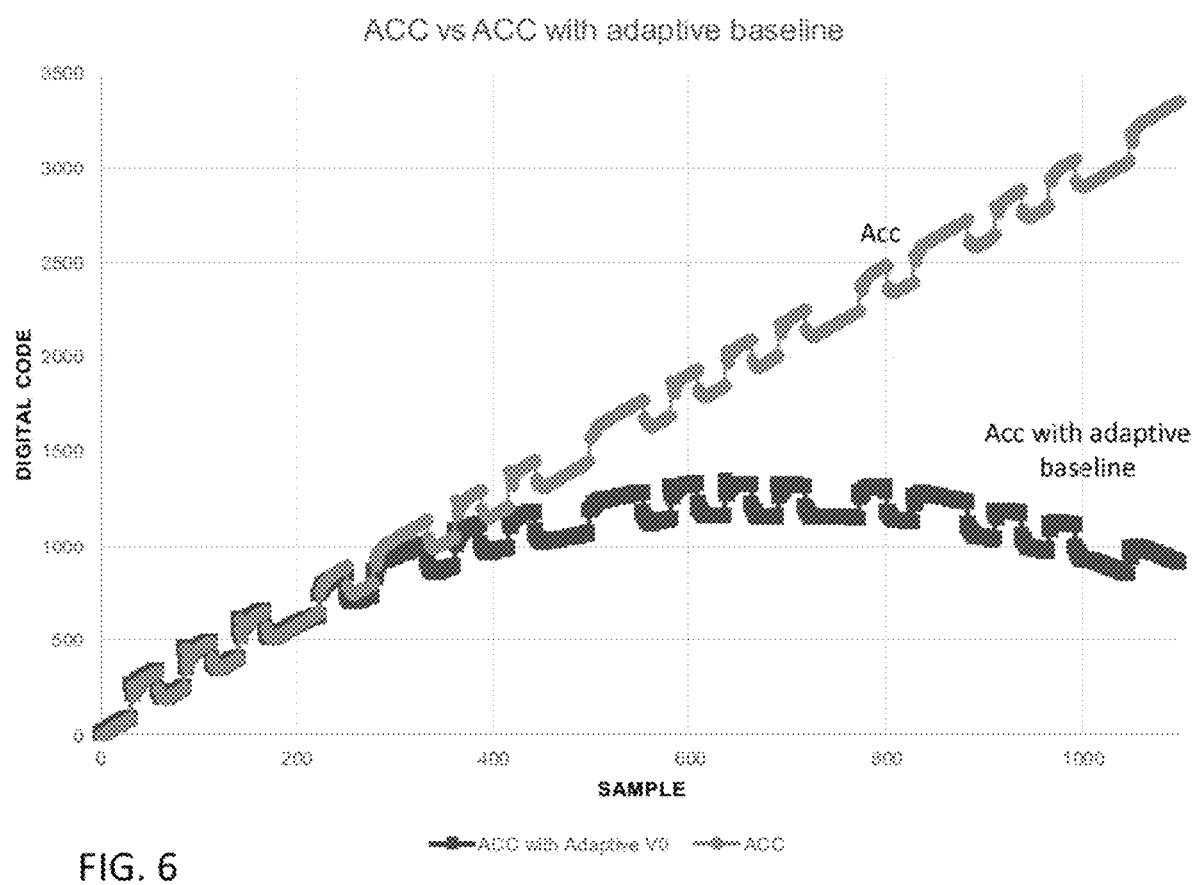
FIG. 6 is a graph showing accumulator output of the data demodulation circuit of FIG. 2, when operating with and without adaptive baseline adjustment.

This operation serves to help keep the effective baseline flat and therefore keep the accumulated digital value Acc within the memory storage range of the accumulator 25 and the filter 26. These results can be seen in FIG. 6, where the accumulated digital value Acc (with the adaptive baseline adjustment described above being used) remains generally flat after sample 400 and changes with the input data, indicating that the baseline has been kept constant, as opposed to the accumulated digital value Acc constantly rising (without the adaptive baseline adjustment described above being used).

Figure 7:
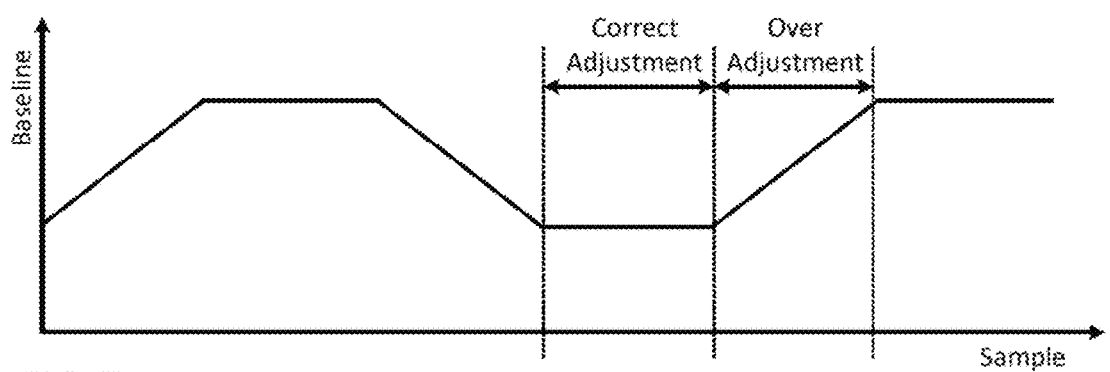
FIG. 7 is a graph showing how overadjustment of the adaptive baseline is possible.
Figure 8:
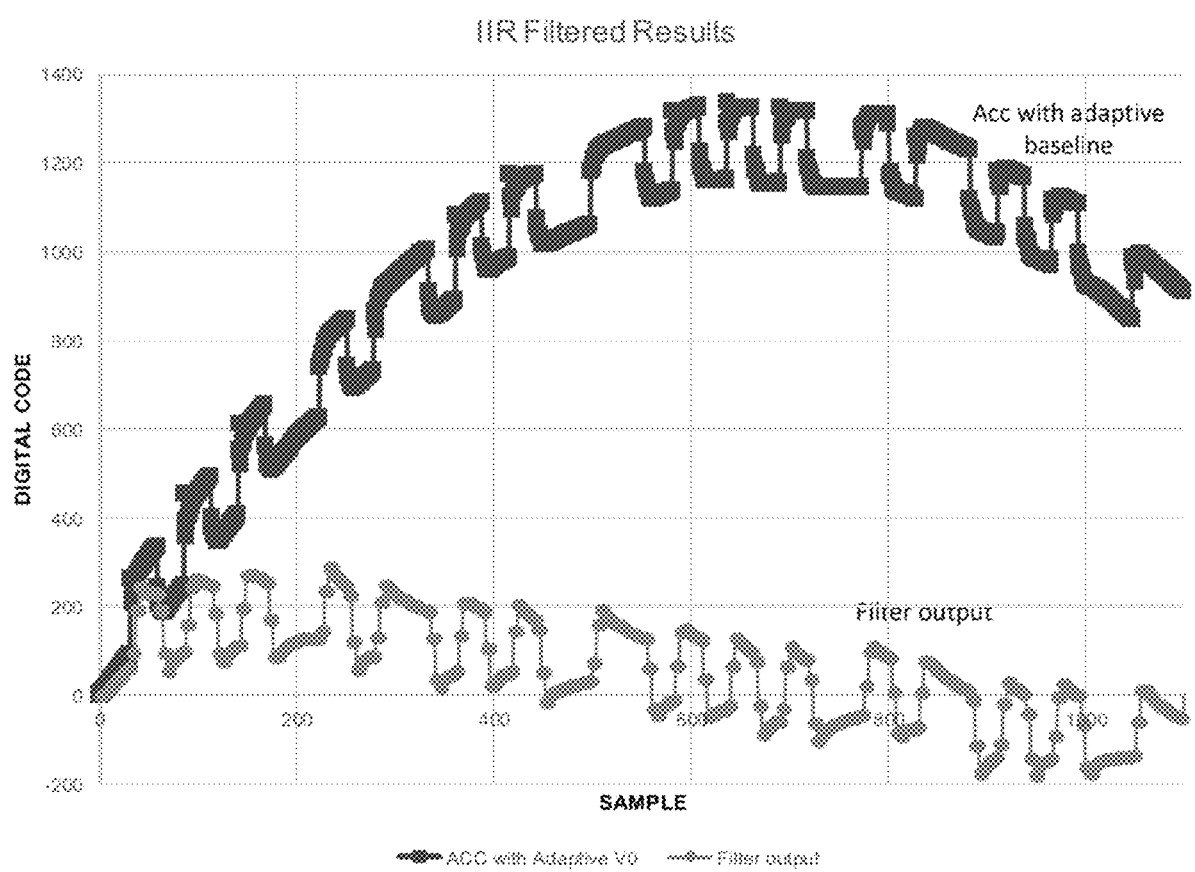
FIG. 8 a graph showing the accumulator output and filter output of the data demodulation circuit of FIG. 2, when operating with adaptive baseline adjustment.

Note that, as can be seen in FIG. 7, the baseline can be over-adjusted, as the baseline is adjusted in increments of 1 or −1, and an adjustment of between −1 and 1 may instead be proper. To correct this, the digital filter 26 is used, helping to further keep the baseline constant and keep the accumulated digital filter output flat, as shown in FIG. 8.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A wireless power transceiver, comprising:
a transceiver coil having first and second terminals;
a controlled switching bridge circuit having first and second inputs coupled to the first and second terminals of the transceiver coil, the controlled switching bridge circuit also having first and second outputs, the second output being coupled to ground;
a controller configured to generate control signals for the controlled switching bridge circuit to cause the controlled switching bridge circuit to generate a time varying signal in a transmitter mode across its first and second inputs;
an analog voltage differential sensing circuit configured, when in the transmitter mode, to sense a power signal across the first and second inputs of the controlled switching bridge circuit at first and second times, and output an analog value representing a difference in voltage of the power signal at the first and second times;

an analog to digital converter configured to digitize the analog value output by the analog voltage differential sensing circuit to produce a digital code;

a compensation circuit configured to, over a period of time, compare a present value of the digital code to a first value of the digital code during the period of time, and subtract a given value from the present value of the digital code if the present value is greater than the first value but add the given value to the present value of the digital code if the present value is less than the first value;

an accumulator configured to accumulate output of the compensation circuit; and a filter configured to filter output of the accumulator.

2. The wireless power transceiver of claim 1, wherein the given value is a logical one.

3. The wireless power transceiver of claim 1, wherein the filter is a bandpass filter.

4. The wireless power transceiver of claim 1, wherein the analog voltage differential sensing circuit comprises:

a first switch coupled between an input and a first node, wherein the first switch is closed when a first control signal is asserted but otherwise open;

a sample/hold capacitor coupled between the first node and ground;

a second switch coupled between the first node and a gain capacitor, wherein the second switch is closed when a second control signal is asserted but otherwise open;

an amplifier having a non-inverting terminal coupled to ground, an inverting terminal coupled to the gain capacitor, and an output coupled to the analog to digital converter;

a feedback capacitor coupled between the non-inverting terminal and output of the amplifier; and a reset switch coupled in parallel with the feedback capacitor, wherein the reset switch is closed when a third control signal is asserted but otherwise open.

5. A data demodulating circuit, comprising:

an analog voltage differential sensing circuit configured to sense a power signal applied to a coil at first and second times, and to output an analog value representing a difference in voltage of the power signal at the first and second times;

an analog to digital converter configured to digitize the analog value output by the analog voltage differential sensing circuit to produce a digital code;

a compensation circuit configured to, over a period of time, compare a present value of the digital code to a first value of the digital code during the period of time, and subtract a given value from the present value of the digital code if the present value is greater than the first value but add the given value to the present value of the digital code if the present value is less than the first value;

an accumulator configured to accumulate output of the compensation circuit; and a filter configured to filter output of the accumulator.

6. The data demodulating circuit of claim 5, wherein the given value is a logical one.

7. The data demodulating circuit of claim 5, wherein the filter is a bandpass filter.

8. The data demodulating circuit of claim 5, wherein the analog voltage differential sensing circuit comprises:

a first switch coupled between an input and a first node, wherein the first switch is closed when a first control signal is asserted but otherwise open;

a sample/hold capacitor coupled between the first node and ground;

a second switch coupled between the first node and a gain capacitor, wherein the second switch is closed when a second control signal is asserted but otherwise open;

an amplifier having a non-inverting terminal coupled to ground, an inverting terminal coupled to the gain capacitor, and an output coupled to the analog to digital converter;

a feedback capacitor coupled between the non-inverting terminal and output of the amplifier; and a reset switch coupled in parallel with the feedback capacitor, wherein the reset switch is closed when a third control signal is asserted but otherwise open.

9. A wireless power transceiver, comprising:

a transceiver coil having first and second terminals;

a controlled switching bridge circuit having first and second inputs coupled to the first and second terminals of the transceiver coil, the controlled switching bridge circuit also having first and second outputs, the second output being coupled to ground;

a voltage regulator coupled between the first output of the controlled switching bridge circuit and an output node;

a power source;

a controller configured to: in a receiver mode, generate control signals for the controlled switching bridge circuit to cause the controlled switching bridge circuit to rectify a time-varying signal at its first and second inputs to produce a rectified output voltage across its first and second outputs; and in a transmitter mode, generate the control signals for the controlled switching bridge circuit to cause the controlled switching bridge circuit to generate a time varying signal across its first and second inputs from the power source;

switch circuitry configured to couple the power source between the output node and ground when the controller is in the receiver mode, but to couple the power source between the first output of the controlled switching bridge circuit and ground when the controller is in the transmitter mode;

an analog voltage differential sensing circuit configured to, when the controller is in the transmitter mode, sense a power signal across the first and second inputs of the controlled switching bridge circuit at first and second times, and output an analog value representing a difference in voltage of the power signal at the first and second times;

an analog to digital converter configured to digitize the analog value output by the analog voltage differential sensing circuit to produce a digital code;

a compensation circuit configured to, over a period of time, compare a present value of the digital code to a first value of the digital code during the period of time, and subtract a given value from the present value of the digital code if the present value is greater than the first value but add the given value to the present value of the digital code if the present value is less than the first value;

an accumulator configured to accumulate output of the compensation circuit; and a filter configured to filter output of the accumulator.

10. The wireless power transceiver of claim 9, wherein the given value is a logical one.

11. The wireless power transceiver of claim 9, wherein the filter is a bandpass filter.

12. The wireless power transceiver of claim 9, wherein the analog voltage differential sensing circuit comprises:
- a first switch coupled between an input and a first node, wherein the first switch is closed when a first control signal is asserted but otherwise open;
- a sample/hold capacitor coupled between the first node and ground;
- a second switch coupled between the first node and a gain capacitor, wherein the second switch is closed when a second control signal is asserted but otherwise open;
- an amplifier having a non-inverting terminal coupled to ground, an inverting terminal coupled to the gain capacitor, and an output coupled to the analog to digital converter;
- a feedback capacitor coupled between the non-inverting terminal and output of the amplifier; and
- a reset switch coupled in parallel with the feedback capacitor, wherein the reset switch is closed when a third control signal is asserted but otherwise open.

13. A wireless power transceiver, comprising:
- a transceiver coil having first and second terminals;
- a controlled switching bridge circuit having first and second inputs coupled to the first and second terminals of the transceiver coil, the controlled switching bridge circuit also having first and second outputs, the second output being coupled to ground;
- a controller configured to generate control signals for the controlled switching bridge circuit to cause the controlled switching bridge circuit to generate a time varying signal in a transmitter mode across its first and second inputs;
- an analog voltage differential sensing circuit configured, when in the transmitter mode, to sense a power signal across the first and second inputs of the controlled switching bridge circuit at first and second times, and output an analog value representing a difference in voltage of the power signal at the first and second times;
- an analog to digital converter configured to digitize the analog value output by the analog voltage differential sensing circuit to produce a digital code, the digital code having a baseline value; and
- a compensation circuit configured to compensate the baseline value for drift.

14. The wireless power transceiver of claim 13, wherein the compensation circuit compensates for the drift by, over a period of time, determining presence of the drift by comparing a present value of the digital code to a first value of the digital code during the period of time, and modifying the digital code based upon the comparison.

15. The wireless power transceiver of claim 13, wherein the analog voltage differential sensing circuit comprises:
- a first switch coupled between an input and a first node, wherein the first switch is closed when a first control signal is asserted but otherwise open;
- a sample/hold capacitor coupled between the first node and ground;
- a second switch coupled between the first node and a gain capacitor, wherein the second switch is closed when a second control signal is asserted but otherwise open;
- an amplifier having a non-inverting terminal coupled to ground, an inverting terminal coupled to the gain capacitor, and an output coupled to the analog to digital converter;
- a feedback capacitor coupled between the non-inverting terminal and output of the amplifier; and
- a reset switch coupled in parallel with the feedback capacitor, wherein the reset switch is closed when a third control signal is asserted but otherwise open.

16. The wireless power transceiver of claim 13, further comprising:
- an accumulator configured to accumulate output of the compensation circuit; and
- a filter configured to filter output of the accumulator.

17. A method of operating a wireless power transceiver, comprising:
- operating a controlled switching bridge to generate a time varying signal across its first and second inputs that are coupled to first and second terminals of a transceiver coil;
- sensing a power signal across the first and second inputs of the controlled switching bridge at first and second times, and outputting an analog value representing a difference in voltage of the power signal at the first and second times;
- digitizing the analog value to produce a digital code, the digital code having a baseline value; and
- compensating the baseline value for drift.

18. The method of claim 17, wherein the baseline value is compensated for drift by, over a period of time, determining presence of the drift by comparing a present value of the digital code to a first value of the digital code during the period of time, and modifying the digital code based upon the comparison.

* * * * *